United States Patent
Pu et al.

(10) Patent No.: US 7,199,459 B2
(45) Date of Patent: Apr. 3, 2007

(54) SEMICONDUCTOR PACKAGE WITHOUT BONDING WIRES AND FABRICATION METHOD THEREOF

(75) Inventors: Han-Ping Pu, Taichung (TW); Chien Ping Huang, Taichung (TW)

(73) Assignee: Siliconware Precision Industries Co., Ltd. (TW)

(*) Notice: Subject to any disclaimer, the term of this patent is extended or adjusted under 35 U.S.C. 154(b) by 29 days.

(21) Appl. No.: 11/126,110

(22) Filed: May 9, 2005

(65) Prior Publication Data
US 2005/0200006 A1 Sep. 15, 2005

Related U.S. Application Data

(63) Continuation-in-part of application No. 10/404,173, filed on Apr. 1, 2003, now Pat. No. 6,891,273.

(30) Foreign Application Priority Data
Jan. 22, 2003 (TW) .............................. 92101310 A

(51) Int. Cl.
H01L 23/538 (2006.01)
H01L 25/065 (2006.01)
H01L 23/28 (2006.01)
H01L 23/31 (2006.01)
H01L 23/52 (2006.01)

(52) U.S. Cl. .............................. 257/686; 257/E23.178; 257/E25.013; 257/E21.512; 257/724; 257/685; 257/723; 257/777; 257/780; 257/701; 257/698; 257/690; 257/738; 257/673

(58) Field of Classification Search ........ 257/E23.178, 257/E25.013, E21.512, 777, 686, 723, 724, 257/728, 698, 696, 690, 692, 701, 738, 778, 257/666
See application file for complete search history.

(56) References Cited

U.S. PATENT DOCUMENTS

| | | | |
|---|---|---|---|
| 5,581,122 A | | 12/1996 | Chao et al. |
| 5,866,953 A | * | 2/1999 | Akram et al. ................ 257/790 |
| 6,165,815 A | * | 12/2000 | Ball ............................ 438/113 |
| 6,365,966 B1 | * | 4/2002 | Chen et al. .................. 257/723 |
| 6,396,136 B2 | | 5/2002 | Kalidas et al. |
| 6,506,632 B1 | | 1/2003 | Cheng et al. |

(Continued)

Primary Examiner—Alexander Oscar Williams
(74) Attorney, Agent, or Firm—Peter F. Corless; Steven M. Jensen; Edwards Angell Palmer & Dodge LLP

(57) ABSTRACT

A semiconductor package without bonding wires and a fabrication method are provided. The semiconductor package includes a substrate having a front surface and a back surface, two chips formed on the front surface, two dielectric layers formed on the chips respectively, two conductive trace layers formed on the dielectric layers respectively, an insulating layer formed on one of the dielectric layers, and a plurality of solder balls implanted on the back surface of the substrate. One of the dielectric layers is formed on one of the chips and attached to an entire non-active surface of the other of the chips.

5 Claims, 5 Drawing Sheets

U.S. PATENT DOCUMENTS

| | | | |
|---|---|---|---|
| 6,555,917 B1 * | 4/2003 | Heo ........................... 257/777 |
| 6,680,529 B2 * | 1/2004 | Chen et al. ................. 257/700 |
| 6,706,557 B2 * | 3/2004 | Koopmans ................. 438/109 |
| 6,847,105 B2 * | 1/2005 | Koopmans ................. 257/686 |
| 6,989,285 B2 * | 1/2006 | Ball ............................ 438/33 |
| 7,019,406 B2 * | 3/2006 | Huang et al. ............... 257/778 |
| 2001/0040285 A1 * | 11/2001 | Ishio et al. ................. 257/690 |
| 2002/0020898 A1 | 2/2002 | Vu et al. |
| 2003/0134455 A1 | 7/2003 | Cheng et al. |
| 2003/0197284 A1 * | 10/2003 | Khiang et al. .............. 257/777 |
| 2004/0070083 A1 * | 4/2004 | Su ............................... 257/778 |
| 2005/0205978 A1 * | 9/2005 | Pu et al. ..................... 257/678 |

* cited by examiner

SEMICONDUCTOR PACKAGE WITHOUT BONDING WIRES AND FABRICATION METHOD THEREOF

CROSS-REFERENCE TO RELATED APPLICATION

This application is a continuation-in-part of application Ser. No. 10/404,173, filed Apr. 01, 2003, now U.S. Pat. No. 6,891,273 B2 the disclosure of which is expressly incorporated herein by reference.

FIELD OF THE INVENTION

The present invention relates to semiconductor packages and fabrication methods thereof, and more particularly, to a semiconductor package, which includes no bonding wires and is for use with a chip having a small pitch between adjacent bond pads or electric contacts, and a method for fabricating the semiconductor package.

BACKGROUND OF THE INVENTION

A ball grid array (BGA) semiconductor package is normally incorporated with a semiconductor chip on a substrate and electrically connects the chip to the substrate via a plurality of bonding wires.

With increasing integration of a chip having higher density of bond pads, more bonding wires need to be formed accordingly and a pitch between adjacent bonding wires is reduced to accommodate more bonding wires on a limited-sized chip. However, the reduced pitch makes adjacent bonding wires more closely arranged with respect to each other; in a subsequent molding process, these closely arranged bonding wires would be easily subject to wire sweep or wire short, thereby adversely affecting quality of a fabricated semiconductor package.

In response to the above problem, U.S. Pat. No. 5,581,122 discloses a semiconductor package in which a ground ring 17 and a power ring 18 are formed on a substrate 10 between bond fingers 102 for being bonded with bonding wires 110 and an area where a chip 11 is mounted, as shown in FIG. 1. Ground wires 112 and power wires 111 are formed to electrically connect ground pads and power pads (not shown) on an active surface of the chip 11 respectively to the ground ring 17 and power ring 18 on the substrate 10, which are arranged spatially in different layers with respect to the bonding wires 110 to thereby increase a pitch between adjacent wires and prevent circuit short due to wire sweep or shift.

However, as the chip is developed with lower profile and higher density of bonding wires, a pitch between adjacent bond pads formed on an active surface of the chip is decreased from 60 μm to 40 μm and even to 30 μm to accommodate more I/O (input/output) connections thereon, in order to reduce fabrication costs and enhance chip performances. As a result, the above layered arrangement of bonding wires is not suitably applied to such a delicate chip with a fine pad pitch.

Moreover, in accordance with the reduced pad pitch of the chip, a pitch between bond fingers formed on the substrate is decreased from 150 μm to 125 μm and even to 100 μm for a new generation of substrates; such a small bond-finger pitch arrangement makes bonding wires bonded thereto easily come into contact with each other and cause circuit short, and the above package structure still fails to solve this problem.

In another aspect, if the bond-pad pitch is further reduced to 30 μm, a current wire bonder may not be feasible to perform such a delicate wire bonding process, and also a conventional etching technique may hardly achieve a pitch below 100 μm between adjacent bond fingers on the substrate.

The above wire-bonding problem may be solved through the use of flip-chip technology. However, the flip-chip technology requires a complex solder bumping process used for electrically connecting the chip to the substrate, and the substrate serving as a chip carrier needs to be manufactured by build-up technology instead of conventional fabrication processes, which would increase production costs of the substrate up to around five times more than that of a conventional substrate; such an expensive substrate is hardly acceptable in the market.

SUMMARY OF THE INVENTION

An objective of the present invention is to provide a semiconductor package and a fabrication method thereof without having to use bonding wires for electrically connecting a chip to a substrate, so as to eliminate circuit short of the bonding wires in a molding process.

Another objective of the invention is to provide a semiconductor package and a fabrication method thereof, which can be applied to a chip with a reduced pitch between adjacent electric contacts without having to use a complex solder bumping process or an expensive substrate made by build-up technology.

In accordance with the foregoing and other objectives, the present invention proposes a semiconductor package without bonding wires, including: a substrate having a front surface and a back surface, the front surface being formed with a chip attach area and a plurality of bond fingers around the chip attach area; at least one chip mounted on the chip attach area, the chip having an active surface and a non-active surface, wherein the active surface of the chip is formed with a plurality of electric contacts each of which corresponds to one of the bond fingers; a dielectric layer applied over the substrate for covering the active surface of the chip and the front surface of the substrate, with the electric contacts and bond fingers being exposed to outside of the dielectric layer; a plurality of conductive traces formed on the dielectric layer for electrically connecting the electric contacts to the bond fingers; an insulating layer for covering the electric contacts, conductive traces, and bond fingers; and a plurality of solder balls implanted on the back surface of the substrate for electrically connecting the chip to an external device.

A method for fabricating the above semiconductor package includes the steps of: preparing a substrate having a front surface and a back surface, the front surface being formed with a chip attach area and a plurality of bond fingers around the chip attach area; mounting at least one chip on the chip attach area, the chip having an active surface and a non-active surface, wherein the active surface of the chip is formed with a plurality of electric contacts each of which corresponds to one of the bond fingers; applying a dielectric layer over the substrate to cover the active surface of the chip and the front surface of the substrate, with the electric contacts and bond fingers being exposed to outside of the dielectric layer; forming a metal layer over the dielectric layer to cover and interconnect the electric contacts and bond fingers; patterning the metal layer to form a plurality of conductive traces, the conductive traces having one end thereof connected to the electric contacts and the other end connected to the corresponding bond fingers; forming an insulating layer over the electric contacts, conductive traces, and bond fingers; and implanting a plurality of solder balls on the back surface of the substrate for electrically connecting the chip to an external device.

By the provision of conductive traces for electrically connecting electric contacts of the chip to bond fingers of the substrate, conventional bonding wires are not required for the electrical connection purpose, which can thereby solve the problem of wire-bonding difficulty for a low profile chip with a reduced pitch between adjacent electric contacts and also can eliminate the occurrence of wire sweep or wire short in a molding process. Moreover, it is not necessary to use a complex solder bumping process for electrical connection between the chip and the substrate or employ an expensive build-up technique to fabricate the substrate, thereby reducing fabrication costs of the semiconductor package.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Preferred embodiments of a semiconductor package and a fabrication method thereof proposed by the present invention are described in detail as follows with reference to FIGS. 2 to 6.

First Preferred Embodiment

Figure 1:
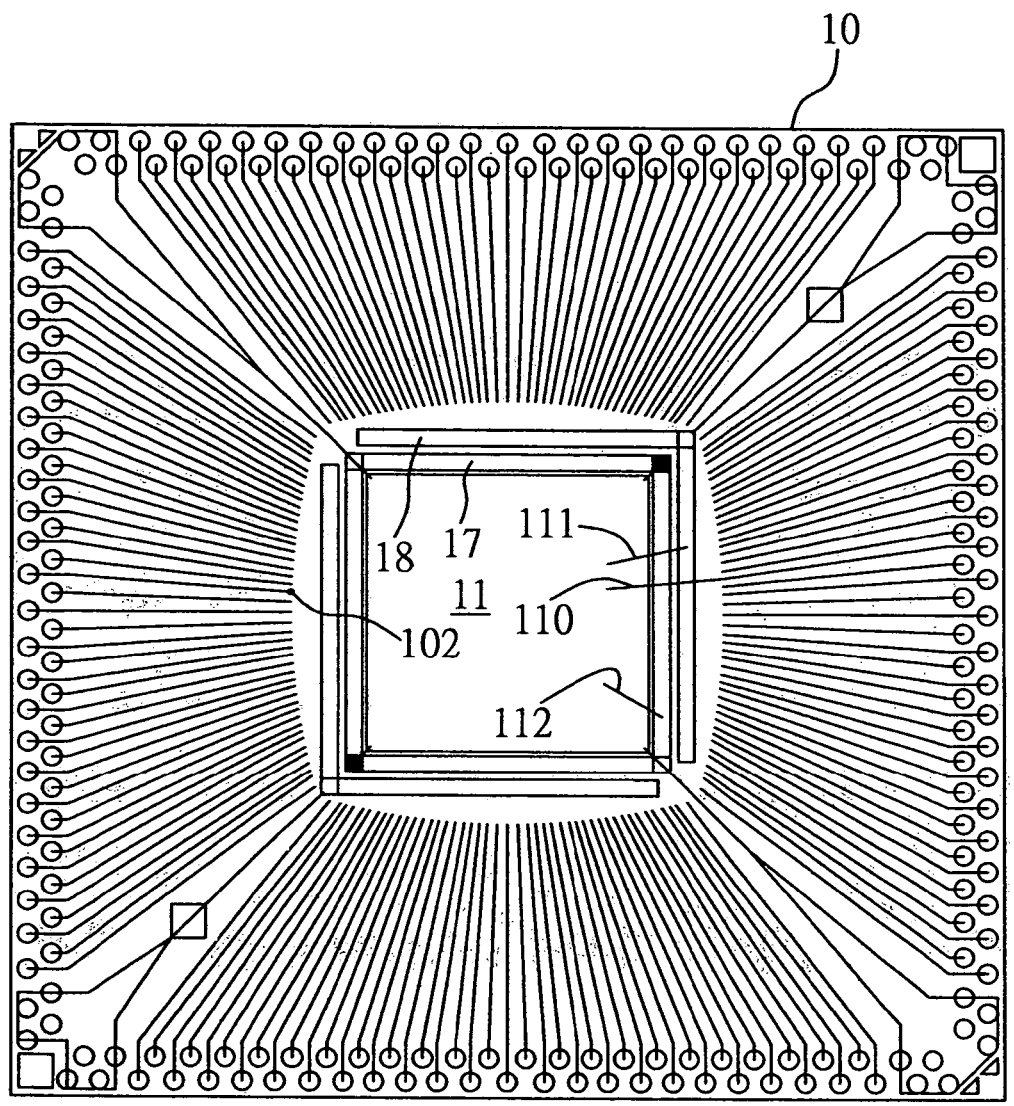
FIG. 1 (PRIOR ART) is a top view of a conventional semiconductor package disclosed by U.S. Pat. No. 5,581,122.
Figure 2:
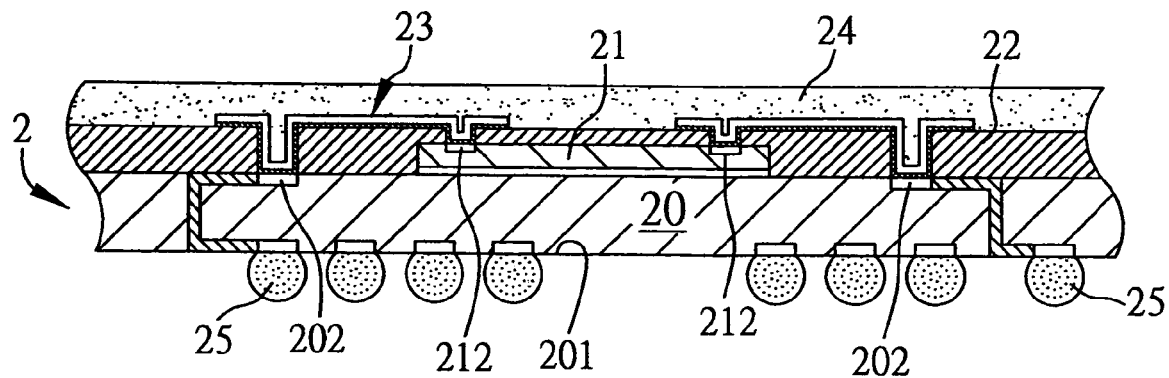
FIG. 2 is a cross-sectional view of a semiconductor package according to a first preferred embodiment of the invention.

As shown in FIG. 2, the semiconductor package 2 according to the invention includes a substrate 20; a semiconductor chip 21 mounted on the substrate 20, the chip 21 being formed with a plurality of electric contacts 212 each of which corresponds to one of bond fingers 202 formed on the substrate 20; an insulating dielectric layer 22 applied over the substrate 20, with the electric contacts 212 and bond fingers 202 being exposed to outside of the dielectric layer 22; a plurality of conductive traces 23 formed on the dielectric layer 22 for electrically connecting the electric contacts 212 to the bond fingers 202; an insulating layer 24 for covering the electric contacts 212, conductive traces 23, and bond fingers 202; and a plurality of solder balls 25 implanted on the bottom of the substrate 20.

The above semiconductor package 2 can be fabricated by procedural steps illustrated in FIGS. 3A to 3E.

Figure 3A:
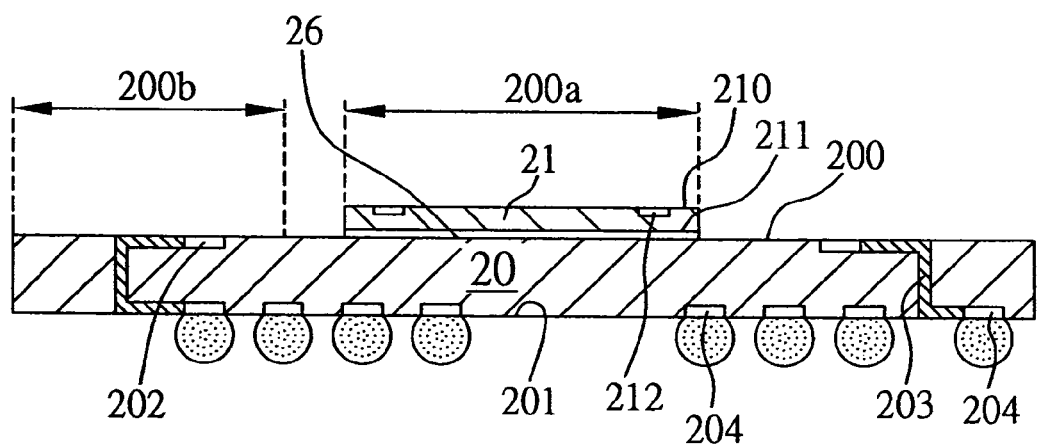
FIGS. 3A–3E are schematic diagrams showing procedural steps for fabricating the semiconductor package shown in FIG. 2.

Referring to FIG. 3A, the first step is to prepare a substrate 20 and at least one semiconductor chip 21. The substrate 20 is made of a conventional material such as BT (bismaleimide triazine) resin, FR-4 resin, ceramic, etc. The substrate 20 has a front surface 200 and a back surface 201 opposed to the front surface 200, wherein the front surface 200 is defined with a chip attach area 200a and a finger forming area 200b around the chip attach area 200a, and the finger forming area 200b is formed with a plurality of bond fingers 202. Each of the bond fingers 202 is electrically coupled through a conductive via 203 to a corresponding ball pad 204 formed on the back surface 201 of the substrate 20 so as to allow signals from the chip 21 mounted on the substrate 20 to be transmitted via the bond fingers 202, substrate 20, and solder balls (not shown) to the outside.

Further as shown in the drawing, a wafer is ground to be 3 mils thick and cut into a plurality of individual semiconductor chips 21, allowing the chip 21 to be attached via an adhesive 26 (such as silver paste) to the chip attach area 200a. The chip 21 has an active surface 210 and a non-active surface 211, wherein the active surface 210 is formed with a plurality of electric contacts 212 each of which corresponds to one of the bond fingers 202 formed on the substrate 20.

Figure 3B:
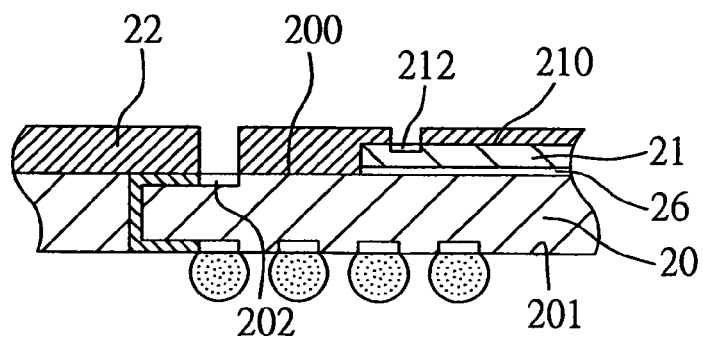

Referring to FIG. 3B, the next step is to apply a dielectric layer 22 over the substrate 20 and the chip 21. The dielectric layer 22 is made of an electrically insulating material such as polyimide or epoxy resin, and is formed by a screen printing or spin coating technique over the front surface 200 of the substrate 20 and the active surface 210 of the chip 21, with the electric contacts 212 and bond fingers 202 being exposed to outside of the dielectric layer 22.

Figure 3C:
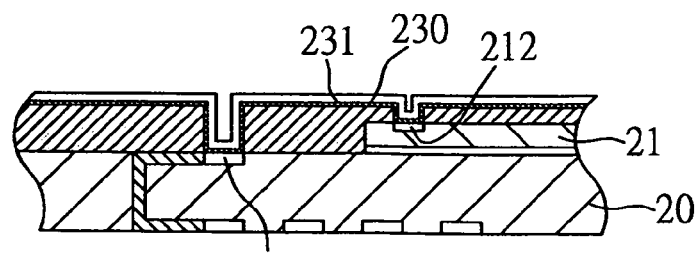

Referring to FIG. 3C, a sputtering or electroless plating technique is employed to apply a thin metal layer 230 over the dielectric layer 22 and the exposed electric contacts 212 and bond fingers 202. The thin metal layer 230 can be made of titanium (Ti), nickel/vanadium (NiV) alloy, titanium/tungsten (Ti/W) alloy, chromium (Cr), nickel (Ni), or copper (Cu). Then, a trace forming layer 231 made of nickel (Ni), copper (Cu), nickel alloy, or copper alloy, is formed by electroplating over the thin metal layer 230 so as to allow the electric contacts 212 of the chip 21 to be electrically connected to the bond fingers 202 on the substrate 20.

Figure 3D:
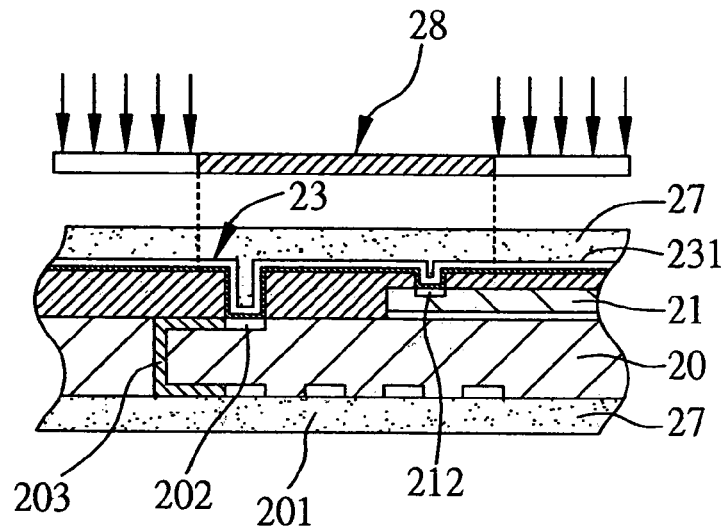

Then, referring to FIG. 3D, a photoresist layer 27 is formed over the trace forming layer 231 and the back surface 201 of the substrate 20 respectively, and a photo mask 28 is used to pattern the thin metal layer 230 and trace forming layer 231 by conventional exposing, developing, and etching processes to form a plurality of conductive traces 23 having one end thereof connected to the electric contacts 212 of the chip 21 and the other end connected to the bond fingers 202 of the substrate 20, such that the electric contacts 212 of the chip 21 can be electrically coupled to the corresponding bond fingers 202 on the substrate 20 without having to utilize conventional wire bonding technology.

Figure 3E:
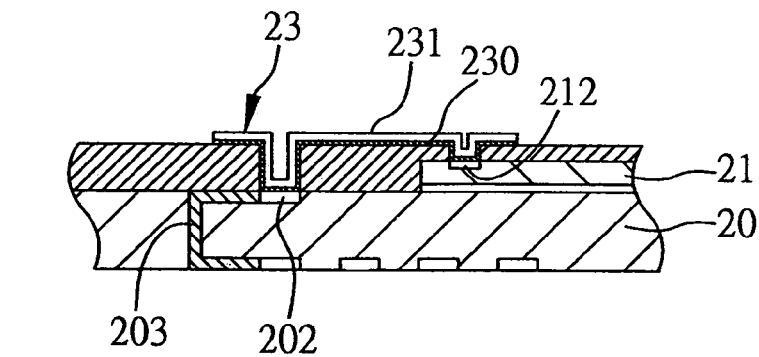

Thereafter, referring to FIG. 3E, after completing patterning of the thin metal layer 230 and trace forming layer 231, a conventional wet or dry stripping process is adopted to remove the photoresist layers (not shown) from the trace forming layer 231 and the back surface 201 of the substrate 20.

Referring back to FIG. 2, an insulating layer 24 made of epoxy resin or polyimide is applied over the front surface 200 of the substrate 20 by a molding or coating technique and covers the electric contacts 212, conductive traces 23, and bond fingers 202. And, a plurality of solder balls 25 are implanted on the back surface 201 of the substrate 20; this forms an electrical connection path including the electric contacts 212, conductive traces 23, bond fingers 202, conductive vias 203, and solder balls 25 for the semiconductor package 2.

Second Preferred Embodiment

Figure 4:
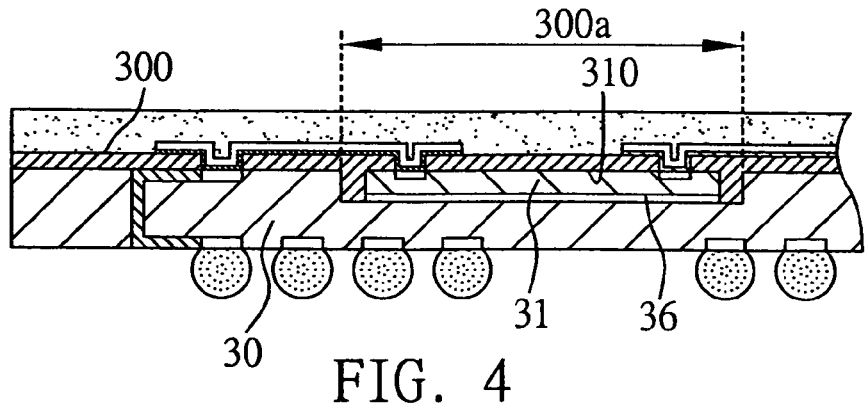
FIG. 4 is a cross-sectional view of a semiconductor package according to a second preferred embodiment of the invention.

FIG. 4 illustrates a semiconductor package according to a second preferred embodiment of the invention. This semiconductor package differs from that of the above first embodiment in that the substrate 30 is formed with an opening 300a larger in surface area than the chip 31, allowing the chip 31 to be received within the opening 300a and adhered to the substrate 30 via an adhesive 36. This structure reduces height difference between an active surface 310 of the chip 31 and a front surface 300 of the substrate 30, thereby diminishing the overall height of the semiconductor package and making a dielectric layer (not designated with a reference numeral) more convenient to be applied over the substrate 30.

Third Preferred Embodiment

Figure 5:
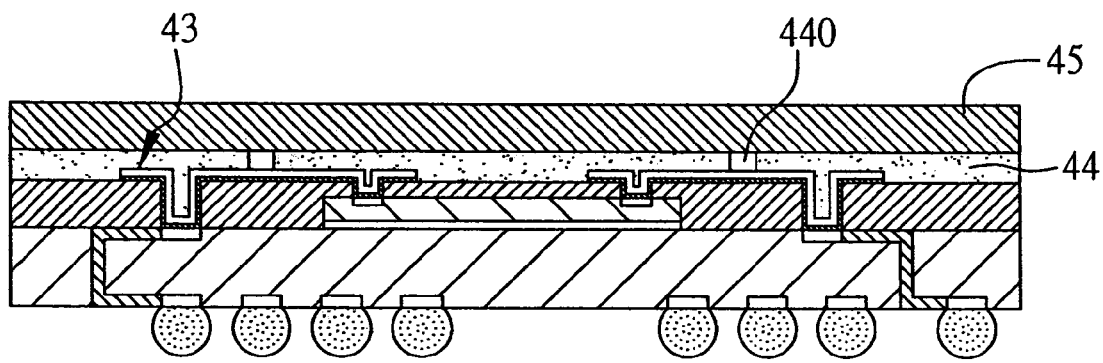
FIG. 5 is a cross-sectional view of a semiconductor package according to a third preferred embodiment of the invention.

FIG. 5 illustrates a semiconductor package according to a third preferred embodiment of the invention. This semiconductor package differs from that of the above first embodiment in that after completing formation of the insulating layer 44, a plurality of openings 440 are formed through the insulating layer 44 at positions corresponding to ground traces 43 i.e. predetermined conductive traces used for the grounding purpose. As a result, a heat sink 45 mounted on the insulating layer 44 can be adapted to be electrically connected to the ground traces 43 via the openings 440 to enhance heat dissipating performances of the semiconductor package and provide an EMI (electric and magnetic interference) shielding effect.

Fourth Preferred Embodiment

Figure 6:
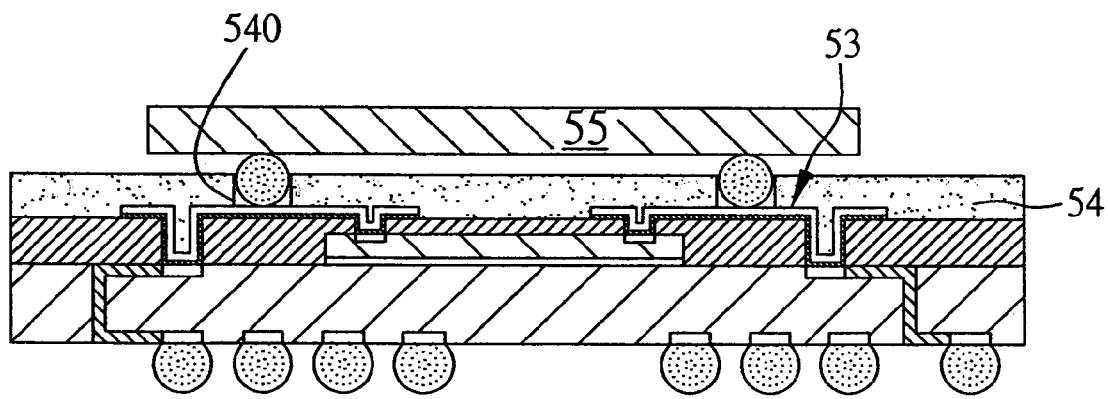
FIG. 6 is a cross-sectional view of a semiconductor package according to a fourth preferred embodiment of the invention.

FIG. 6 illustrates a semiconductor package according to a fourth preferred embodiment of the invention. This semiconductor package differs from that of the above first embodiment in that after completing formation of the insulating layer 54, a plurality of openings 540 are formed through the insulating layer 54 at positions corresponding to the conductive traces 53, so as to allow another package assembly (not shown) or chip 55 to be electrically connected to the semiconductor package via the openings 540 to thereby form a multi-chip module (MCM).

Fifth Preferred Embodiment

Figure 7:
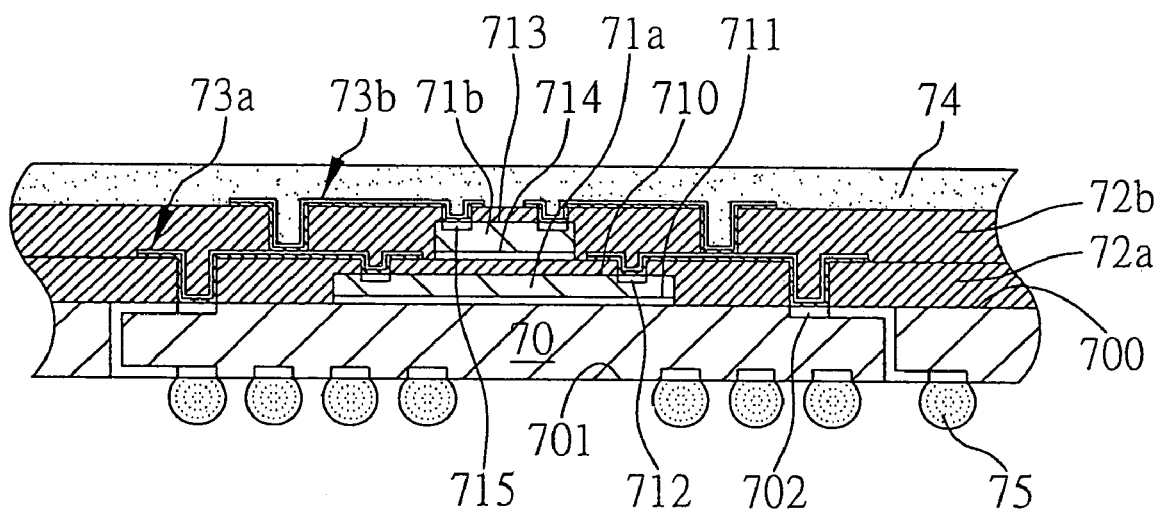
FIG. 7 is a cross-sectional view of a semiconductor package according to a fifth preferred embodiment of the invention.

FIG. 7 illustrates a semiconductor package according to a fifth preferred embodiment of the invention. The fabrication method and structure of this semiconductor package in the fifth embodiment are substantially the same as those in the foregoing embodiments, with a primary difference in that a plurality of semiconductor chips are stacked in this semiconductor package to form a multi-chip package structure.

As shown in FIG. 7, the semiconductor package includes a substrate 70 having a front surface 700 and a back surface 701 opposite to the front surface 700, the front surface 700 being formed with a chip attach area (not shown) and a plurality of bond fingers 702 around the chip attach area; at least one first chip 71a having an active surface 710 and a non-active surface 711 opposite to the active surface 710, wherein the first chip 71a is mounted via its non-active surface 711 on the chip attach area, and the active surface 710 of the first chip 71a is formed with a plurality of electric contacts 712; a first dielectric layer 72a applied over the front surface 700 of the substrate 70, for covering the active surface 710 of the first chip 71a and the front surface 700 of the substrate 70, with the electric contacts 712 of the first chip 71a and the bond fingers 702 of the substrate 70 being exposed from the first dielectric layer 72a; at least one first conductive trace layer 73a formed on the first dielectric layer 72a, for electrically connecting the electric contacts 712 of the first chip 71a to the bond fingers 702 of the substrate 70; at least one second chip 71b having an active surface 713 and a non-active surface 714 opposite to the active surface 713, wherein the second chip 71b is mounted via its non-active surface 714 on the first dielectric layer 72a, and the active surface 713 of the second chip 71b is formed with a plurality of electric contacts 715; at least one second dielectric layer 72b applied over the first conductive trace layer 73a, the first dielectric layer 72a and the first chip 71a, with a portion of the first conductive trace layer 73a and the electric contacts 715 of the second chip 71b being exposed from the second dielectric layer 72b; at least one second conductive trace layer 73b formed on the second dielectric layer 72b, for electrically connecting the electric contacts 715 of the second chip 71b to the portion of the first conductive trace layer 73a; an insulating layer 74 for covering the second conductive trace layer 73b and the second dielectric layer 72b; and a plurality of solder balls 75 implanted on the back surface 701 of the substrate 70.

It is understood that the stacking process can be continued to form a semiconductor package structure with a plurality of stacked chips. Moreover, the insulating layer can be formed with a plurality of apertures corresponding in position to the second conductive trace layer, for electrical connection with external electronic elements.

By the foregoing provision of conductive traces for electrically connecting electric contacts of the chip to bond fingers of the substrate, conventional bonding wires are not required for the electrical connection purpose, which can thereby solve the problem of wire-bonding difficulty for a low profile chip with a reduced pitch between adjacent electric contacts and also can eliminate the occurrence of wire sweep or wire short in a molding process. Moreover, it is not necessary to use a complex solder bumping process for electrical connection between the chip and the substrate or employ an expensive build-up technique to fabricate the substrate, thereby reducing fabrication costs of the semiconductor package.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package, comprising:
   a substrate having a front surface and a back surface opposite to the front surface, the front surface being formed with a chip attach area and a plurality of bond fingers around the chip attach area;
   at least one first chip having an active surface and a non-active surface opposite to the active surface, wherein the first chip is mounted to the substrate in a manner that the non-active surface of the first chip is attached to the substrate within the first chip attach area, and the active surface of the first chip is formed with a plurality of first electric contacts;

a first dielectric layer formed on the entire front surface of the substrate, for covering the active surface of the first chip and the front surface of the substrate, with the first electric contacts of the first chip and the bond fingers of the substrate being exposed from the first dieleciric layer;

at least one first conductive trace layer formed on the first dielectric layer, for electrically connecting the first electric contacts of the first chip to the bond fingers of the substrate;

at least one second chip having an active surface and a non-active surface opposite to the active surface, wherein the second chip is mounted to the first dielectric layer in a manner that the entire non-active surface of the second chip is attached to the first dielectric layer, and the active surface of the second chip is formed with a plurality of second electric contacts;

at least one second dielectric layer formed on the first conductive trace layer, the first dielectric layer and the first chip, with a portion of the first conductive trace layer and the second electric contacts of the second chip being exposed from the second dielectric layer;

at least one second conductive trace layer formed on the second dielectric layer, for electrically connecting the second electric contacts of the second chip to the portion of the first conductive trace layer;

an insulating layer for covering the second conductive trace layer and the second dielectric layer; and a plurality of solder balls implanted on the back surface of the substrate.

2. The semiconductor package of claim 1, wherein the first and second chips are each ground to a thickness below 3 mils.

3. The semiconductor package of claim 1, wherein the first and second dielectric layers are each made of an electrically insulating material selected from the group consisting of polyimide and epoxy resin.

4. The semiconductor package of claim 1, wherein the insulating layer is made of epoxy resin or polyimide.

5. The semiconductor package of claim 1, wherein the insulating layer is formed with a plurality of apertures corresponding in position to the second conductive trace layer, for electrical connection with external electronic elements.

* * * * *